(12) United States Patent
Chen

(10) Patent No.: US 8,247,838 B2
(45) Date of Patent: Aug. 21, 2012

(54) LIGHT EMITTING DIODE WITH SEMICONDUCTOR LAYER HAVING DIFFERENT RESISTANCE AT DIFFERENT REGIONS

(75) Inventor: Yu-Hsien Chen, Taipei (TW)

(73) Assignee: United Microelectronics Corporation, Hsinchu (TW)

( * ) Notice: Subject to any disclaimer, the term of this patent is extended or adjusted under 35 U.S.C. 154(b) by 102 days.

(21) Appl. No.: 12/641,327

(22) Filed: Dec. 18, 2009

(65) Prior Publication Data

US 2011/0147790 A1 Jun. 23, 2011

(51) Int. Cl.
*H01L 33/26* (2010.01)
(52) U.S. Cl. .................. 257/101; 257/E25.028
(58) Field of Classification Search .......... 257/98, 257/99, 100, 101, E33.043, 13, 79, E33.029, 257/E25.028, E25.032; 438/37
See application file for complete search history.

(56) References Cited

U.S. PATENT DOCUMENTS

| 5,202,278 | A | 4/1993 | Mathews et al. |
| 5,568,499 | A * | 10/1996 | Lear .......................... 372/45.01 |
| 6,771,018 | B2 | 8/2004 | Toguchi et al. |
| 7,288,491 | B2 | 10/2007 | Collins et al. |
| 2003/0219918 | A1 * | 11/2003 | Shinohara et al. ............. 438/22 |
| 2005/0082562 | A1 * | 4/2005 | Ou et al. ....................... 257/103 |

* cited by examiner

*Primary Examiner* — Victor A Mandala
*Assistant Examiner* — Selim Ahmed
(74) *Attorney, Agent, or Firm* — Chun-Ming Shih

(57) ABSTRACT

A light emitting diode and a fabricating method thereof are provided. The method including the steps of sequentially forming a first-type semiconductor layer, a light emitting layer and a second-type semiconductor layer with a first region and a second region on a substrate. Next, an ion implantation process is performed to make the resistance of the first region be larger than of the second region. Afterward, a first electrode is formed above the first region of the second-type semiconductor layer. Since the method uses the ion implantation process to make the inner resistance of the second-type semiconductor layer various, the light emitting intensity and efficiency may both be increased.

13 Claims, 10 Drawing Sheets

LIGHT EMITTING DIODE WITH SEMICONDUCTOR LAYER HAVING DIFFERENT RESISTANCE AT DIFFERENT REGIONS

BACKGROUND

1. Technical Field

The present invention generally relates to a light emitting element and fabricating method thereof and more particularly to a light emitting diode (LED) and fabrication method thereof.

2. Description of the Related Art

Recently, since luminescence efficiency of LEDs has been constantly upgraded, application of fluorescent lamps and/or incandescent bulbs is gradually replaced with LEDs in some fields, such as scanning light source which requires high speed response, back or front light source of a liquid crystal display (LCD), car dashboard illumination, traffic signs and general illumination devices. Compared with the traditional bulbs, LED has absolute advantages. For example, an LED is physically compact, long lasting, low voltage/current driven, durable, mercury free (pollution free) and with high emissivity (power saving) etc.

FIG. 1 is a schematic cross-sectional view of the conventional light emitting diode. Referring to FIG. 1, light emitting diode 100 is composed of a substrate 110, an N-type semiconductor layer 120, an electrode 122, a light emitting layer 130, a P-type semiconductor layer 140 and an electrode 142. The N-type semiconductor layer 120, the light emitting layer 130, the P-type semiconductor layer 140 and the electrode 142 are sequentially disposed on the substrate 110. Furthermore, there is only a portion of the N-type semiconductor layer 120 covered by the light emitting layer 130 and the electrode 122 is disposed on the portion of the N-type semiconductor layer 120 which is uncovered by the light emitting layer 130.

Referring to FIG. 1 again, voltage difference between the N-type semiconductor layer 120 and the P-type semiconductor layer 140 is generated by applying voltages to the electrode 122 and the electrode 142 from external circuit. Then, the electrons provided by the N-type semiconductor layer 120 and the holes provided by the P-type semiconductor layer 140 are combined in the light emitting layer 130, thus the light-emitting layer emits light. However, since the holes provided by the P-type semiconductor layer 140 mostly inject into a portion of the light emitting layer 130 exactly under the electrode 142, the other portions of the light emitting layer 130 cannot emit light by insufficient carriers therein. Therefore, the intensity of the light provided by the light emitting diode 100 is not sufficient.

For solving the aforementioned problem, the area of the electrode 142 above the P-type semiconductor layer 140 is enlarged so that the electrons and holes may inject into mostly portions of the light emitting layer 130 and combine to each other. However, since the material of the electrode 142 is opaque, the light emitting area of the light emitting diode 100 would be decreased with enlarging area of the electrode 142. Accordingly, the emitting efficiency of the light emitting diode 100 cannot be enhanced by way of enlarging the area of the electrode 142.

BRIEF SUMMARY

Accordingly, the present invention is directed to a light emitting diode which may emit light with improved intensity and efficiency.

The present invention is also directed to a method for fabricating light emitting diode to increase the intensity and efficiency of light emitted from the light emitting diode.

The present invention provides a light emitting diode including a substrate, a first-type semiconductor layer, a light emitting layer, a second-type semiconductor layer and a first electrode. The substrate has a first surface and a second surface. The first-type semiconductor layer is disposed on the first surface of the substrate. The light emitting layer and the second-type semiconductor layer are sequentially disposed on the first-type semiconductor layer. Moreover, the second-type semiconductor layer has a first region with a first resistance and a second region with a second resistance smaller than the first resistance. The first electrode is disposed above the first region of the second-type semiconductor layer.

In one embodiment of the present invention, the second-type semiconductor layer is doped with a dopant with different distribution densities in the first region compared to that in the second region. For example, the dopant is of first-type dopant and the first region has larger distribution density than that of the second region. In other embodiment, the dopant may be of second type and the first region has smaller distribution density than that of the second region.

In one embodiment of the present invention, the second-type semiconductor layer is doped with different dopants in the first region compared to those in the second region.

In one embodiment of the present invention, the substrate is conductive.

In one embodiment of the present invention, the light emitting diode further includes a second electrode disposed at the second surface of the substrate.

In one embodiment of the present invention, the light emitting diode further includes a second electrode, and a part of the first-type semiconductor layer is covered by the light emitting layer. Furthermore, the second electrode is disposed on another part of the first-type semiconductor layer exposed by the light emitting layer.

In one embodiment of the present invention, the second-type semiconductor layer has a rough surface and the first electrode is disposed above the rough surface.

In one embodiment of the present invention, the light emitting diode further includes a current spreading layer disposed on the second-type semiconductor layer, and the first electrode is disposed on the current spreading layer.

In one embodiment of the present invention, materials of the current spreading layer may be transparent conductive materials.

In one embodiment of the present invention, materials of the first-type semiconductor layer, the light emitting layer and the second-type semiconductor layer may be III-V group compound semiconductor materials.

The invention also provides a method for fabricating light emitting diode. The method includes providing a substrate having a first surface and a second surface. Next, a first-type semiconductor layer, a light emitting layer and a second-type semiconductor layer are formed sequentially at the first surface of the substrate. The second-type semiconductor layer has a first region with a first resistance and a second region with a second resistance. Then, an ion implantation process is performed for enhancing the first resistance to be larger than the second resistance. Subsequently, a first electrode is formed above the second-type semiconductor layer.

In one embodiment of the present invention, a dopant is implanted into the second-type semiconductor layer with different distribution densities in the first region compared to that in the second region during the ion implantation process. For example, the first distribution density is larger than that of the second distribution density as the dopant is of first-type. In other embodiments, the first distribution density is smaller than that of the second distribution density as the dopant is of second-type.

In one embodiment of the present invention, the first region and the second region of the second-type semiconductor layer are respectively doped with a dopant by different implanting angles or implanting energy during the ion implantation process.

In one embodiment of the present invention, the second-type semiconductor layer is doped with different dopants in the first region compared to those in the second region during the ion implantation process.

In one embodiment of the present invention, the substrate is conductive.

In one embodiment of the present invention, a second electrode may be formed at the second surface of the substrate.

In one embodiment of the present invention, before forming the first electrode, a portion of the second-type semiconductor layer and the light emitting layer may be removed to exposing a part of the first-type semiconductor layer and a second electrode is formed on the exposed part of the first-type semiconductor layer.

In one embodiment of the present invention, before forming the first electrode, a current spreading layer may be formed on the second-type semiconductor layer.

In the light emitting diode of the invention, the second-type semiconductor layer with different resistances is formed on the light emitting layer, thus the carriers injected into the portion of the light emitting layer exactly under the second electrode can be reduced to prevent the effective light emitting area of the light emitting layer from gathered exactly under the first electrode. Thus, the light may be emitted from the portion of the light emitting layer exposed by the second electrode so that the light emitting intensity of the light emitting diode may be improved.

Additionally, the second-type semiconductor layer of the invention is doped with dopants by performing ion implantation process so that the surface of the second-type semiconductor layer subjected to the ion collision may be roughened to form a rough surface while the inner resistance of the second-type semiconductor layer is changed. Therefore, the probability of total reflection of the light emitted from the light emitting layer at the rough surface may be decreased and the light emitting efficiency of the light emitting diode may be increased.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
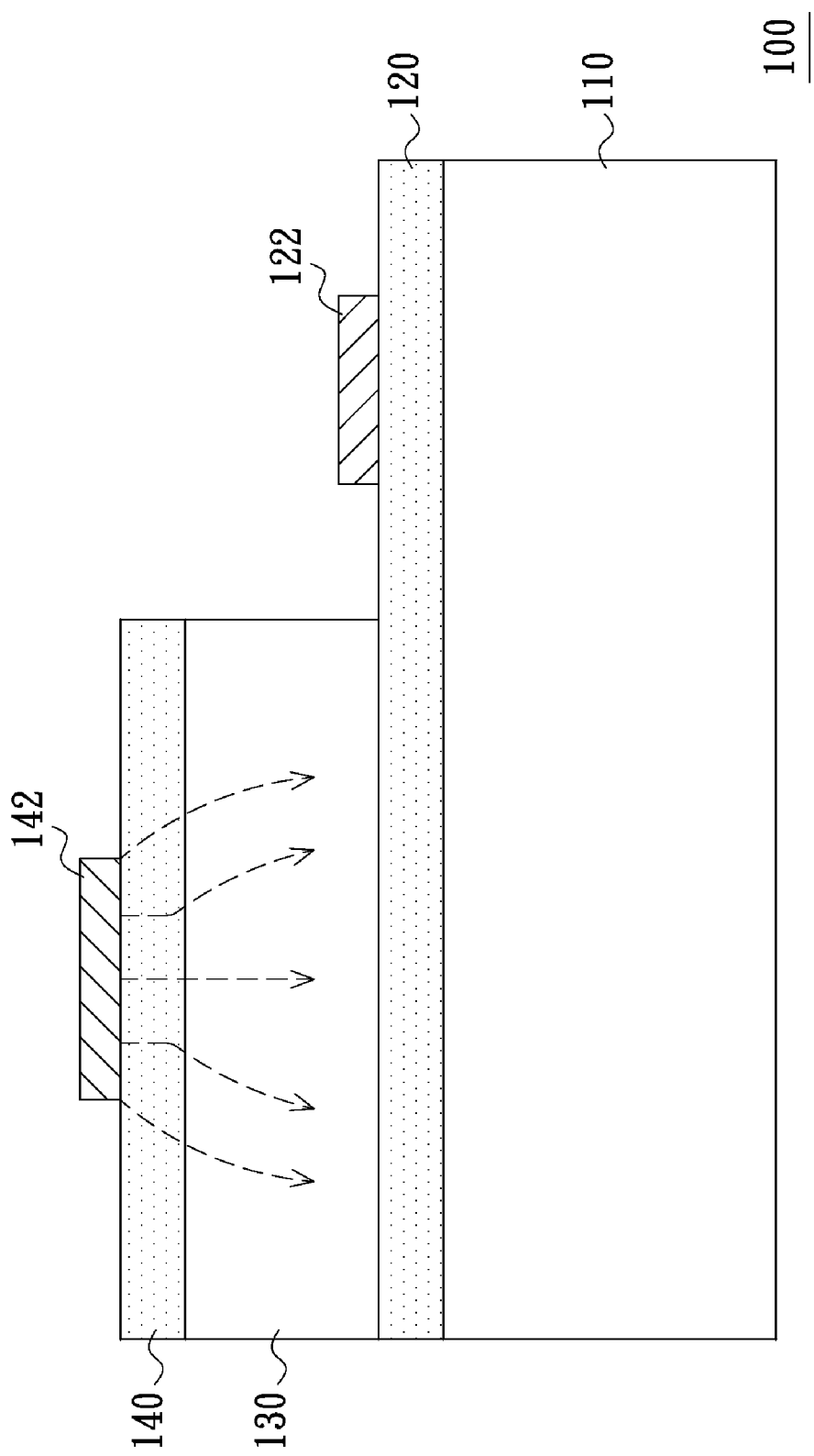
FIG. 1 is a schematic cross-sectional view of the conventional light emitting diode.
Figure 2:
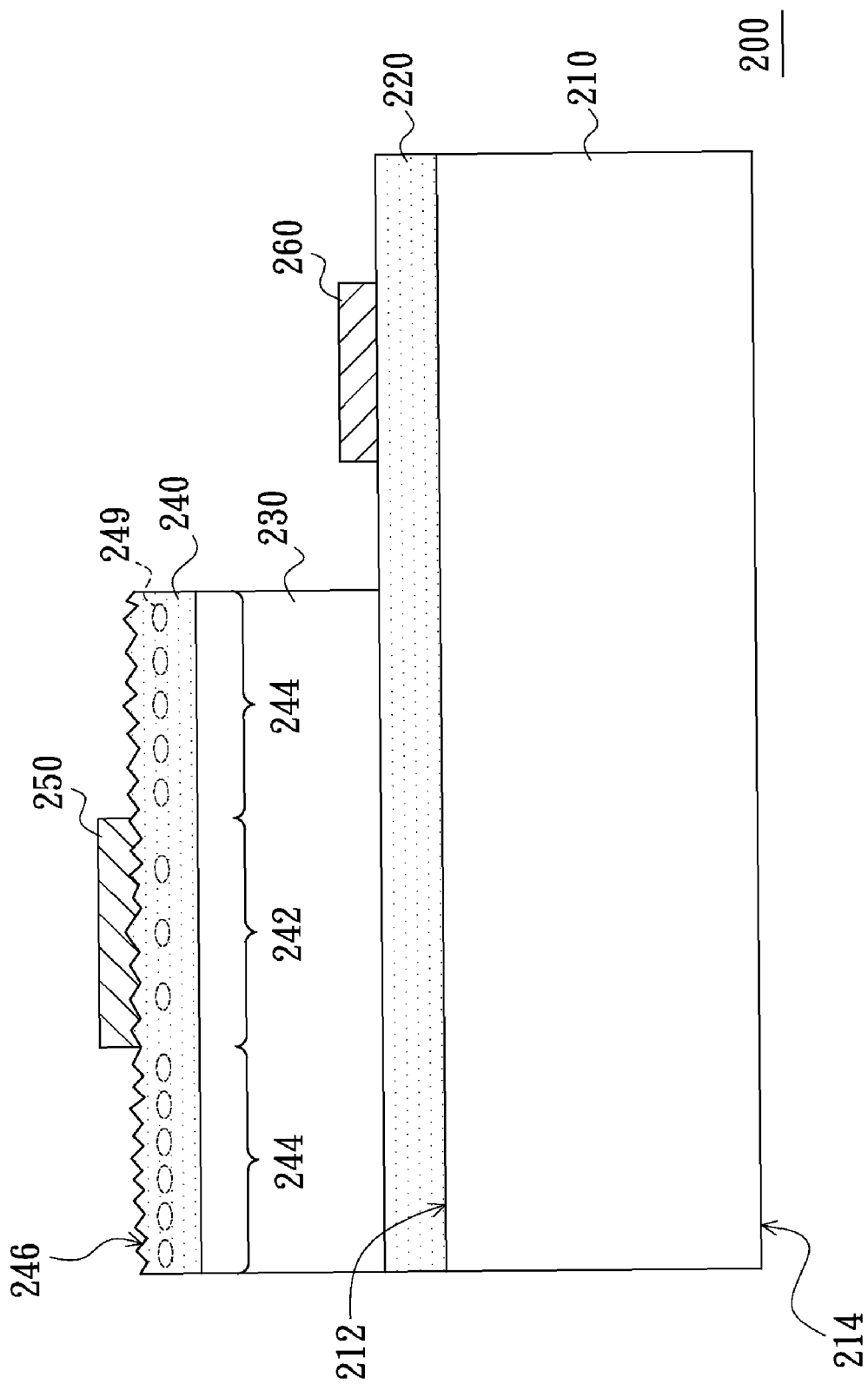
FIG. 2 is a schematic cross-sectional view of a light emitting diode in accordance with an embodiment of the present invention.

FIG. 2 is a schematic cross-sectional view of a light emitting diode in accordance with an embodiment of the present invention. Referring to FIG. 2, light emitting diode 200 includes a substrate 210, a first-type semiconductor layer 220, a light emitting layer 230, a second-type semiconductor layer 240, a first electrode 250 and a second electrode 260. The substrate 210 has a first surface 212 and a second surface 214 opposite to each other. The first-type semiconductor layer 220 is disposed at the first surface 212 of the substrate 210. The light emitting layer 230 and the second-type semiconductor layer 240 are sequentially disposed on a portion of the first-type semiconductor layer 220.

In detail, the first-type semiconductor layer 220 of this embodiment is, for example, a P-type semiconductor layer and the second-type semiconductor layer 240 is, for example, an N-type semiconductor layer, but the invention is not limited thereto. In other embodiments, the first-type semiconductor layer 220 may be an N-type semiconductor layer and the second-type semiconductor layer 240 may be a P-type semiconductor layer. Moreover, the first-type semiconductor layer 220, the light emitting layer 230 and the second-type semiconductor layer 240 are composed of, for example, III-V group compound semiconductor materials. Specifically, material of the first-type semiconductor layer 220 may be gallium nitride doped with P-type dopant and material of the second-type semiconductor layer 240 may be gallium nitride doped with N-type dopant. Furthermore, the light emitting layer 230 may be a multi quantum well (MQW) mainly composed of elements of III-V group, such as gallium nitride, gallium arsenide, gallium phosphide, aluminum nitride, indium nitride, gallium arsenide phosphide, indium gallium nitride, aluminum gallium nitride, gallium indium arsenide nitride and gallium indium phosphide nitride.

The second-type semiconductor layer 240 has a first region 242 with a first resistance and a second region 244 with a second resistance. Further, the first resistance is larger than the second resistance. It should be noted that the resistances may be the same or may not be the same in every unit area in the first region 242 and the second region 244 of the second-type semiconductor layer 240. For example, if the resistances in every unit area are different in the first region 242 and the second region 244, the first resistance and second resistance are respectively the average resistance of the first region 242 and the second region 244. That is, the average resistance of the first region 242 is larger than the average resistance of the second region 244.

Figure 3:
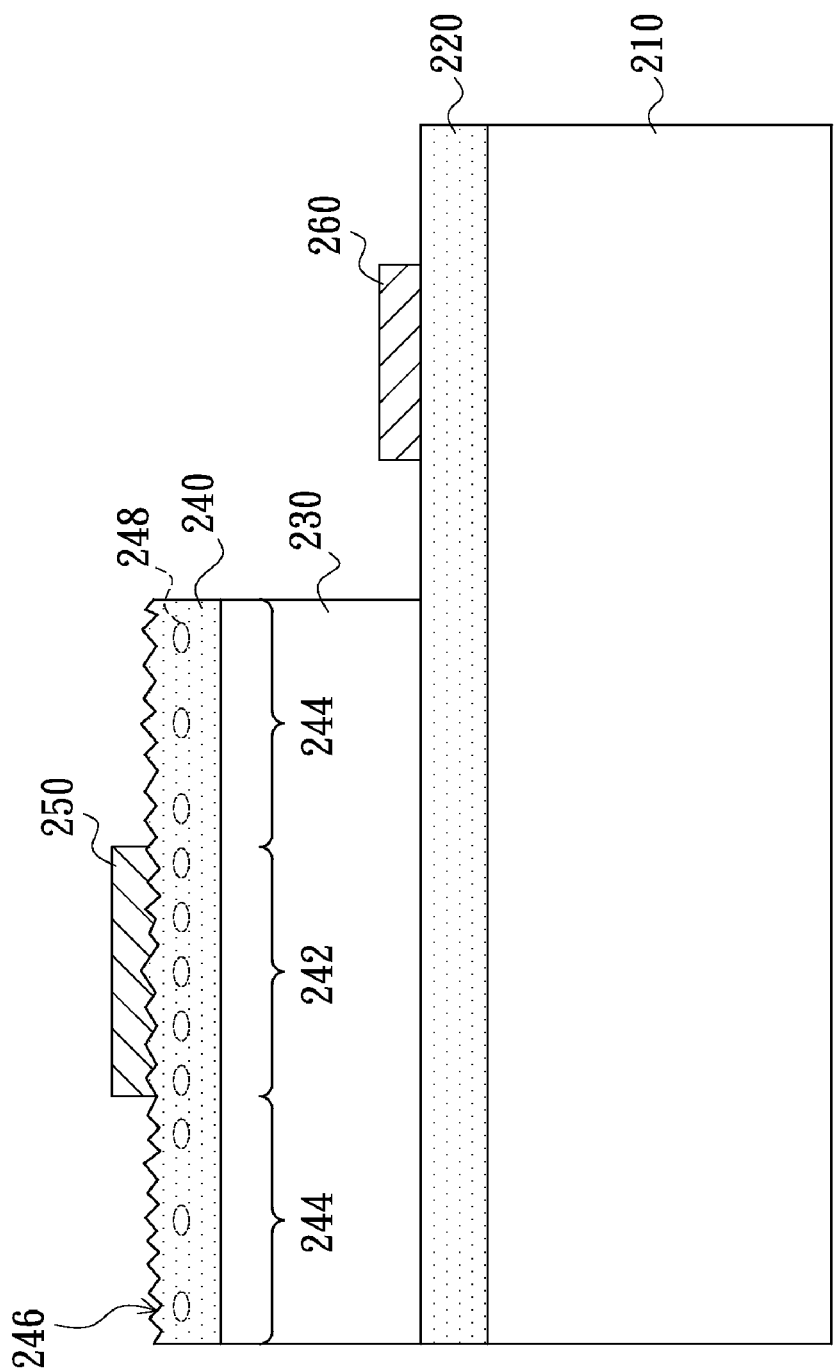
FIG. 3 is a schematic cross-sectional view of a light emitting diode in accordance with another embodiment of the present invention.

In this embodiment, the second-type semiconductor layer 240 is doped with a dopant with different distribution densities in the first region 242 compared to that in the second region 244, thus the first resistance is larger than the second resistance. For example, the second-type semiconductor layer 240 of this embodiment is doped with second-type dopants 249 which are the same type therewith, such as arsenic or phosphorous. Specifically, the distribution density of the dopants doping in the first region 242 is smaller than that in the second region 244. It should be noted that the atomic properties of the dopant doped into the second-type semiconductor layer 240 are not limited thereto. In other embodiments, as illustrated in FIG. 3, the second-type semiconductor layer 240 may be doped with first-type dopants 248 which are different type therefrom, such as gallium or indium. Accordingly, since the polarity of the first-type dopants 248 is opposite to the polarity of the second-type semiconductor layer 240, the first region 242 should be doped with more dopants than the second region 244 been, thus the first resistance is larger than the second resistance.

Besides, the second-type semiconductor layer 240 may be doped with nonpolar dopant, such as gallium, for changing lattice structure of the second-type semiconductor layer 240, thus the first resistance is larger than the second resistance.

In the aforementioned embodiments, for making the first resistance being larger than the second resistance, the second-type semiconductor layer 240 is doped with the same dopants but different distribution densities in the first region 242 and the second region 244. In another embodiment, the second-type semiconductor layer 240 may be doped with different dopants in the first region 242 compared to those in the second region 244 to make the first resistance is larger than the second resistance.

Specially, the dopants are implanted into the second-type semiconductor layer 240 by way of ion collision, therefore the surface of the second-type semiconductor layer 240 collided with the dopants would be roughened, thus a rough surface 246 is formed. Therefore, the probability of total reflection of the light emitted from the light emitting layer 230 at the rough surface 246 may be decreased. Thus, the light emitting efficiency of the light emitting diode 200 may be increased.

The second electrode 260 is disposed on a portion of the first-type semiconductor layer 220 exposed by the light emitting layer 230 and the first electrode 250 is disposed above the first region 242 of the second-type semiconductor layer 240. A plurality of carriers provided from the first-type semiconductor layer 220 and the second-type semiconductor layer 240 inject into the light emitting layer 230 while voltages are applied to the first electrode 250 and the second electrode 260, thus currents are generated between the first-type semiconductor layer 220 and the second-type semiconductor layer 240. At this time, since the first resistance of the first region 242 is larger than the second resistance of the second region 244, the currents generated between the first-type semiconductor layer 220 and the second-type semiconductor layer 240 can be spread from the first region 242 to the second region 244. Therefore, the carriers, i.e. electrons and holes, provided by the first-type semiconductor layer 220 and the second-type semiconductor layer 240 may combine to each other everywhere in the light emitting layer 230 and exciting the light emitting layer 230 to emit light. Thus, the light emitting intensity of the light emitting diode 200 may be enhanced.

Figure 4:
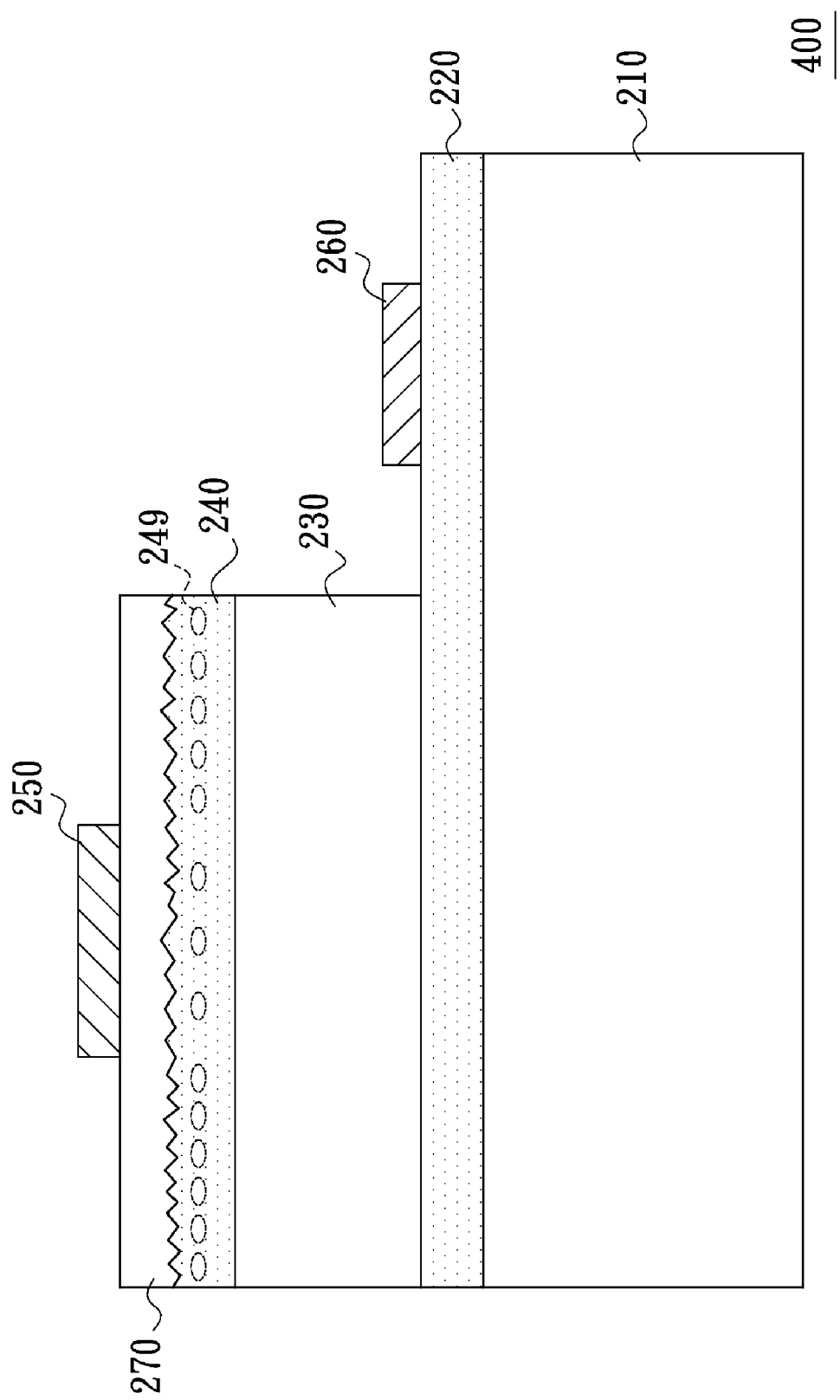
FIG. 4 is a schematic cross-sectional view of a light emitting diode in accordance with another embodiment of the present invention.

FIG. 4 is a schematic cross-sectional view of a light emitting diode in accordance with another embodiment of the present invention. Referring to FIG. 4, the structure of the light emitting diode 400 is similar to the aforementioned light emitting diode 200, the difference therebetween would be described as the following.

In this embodiment, a current spreading layer 270 is disposed on the second-type semiconductor layer 240 and the first electrode 250 is disposed on the current spreading layer 270. Therefore, the carriers provided from the first-type semiconductor layer 220 and the second-type semiconductor layer 240 may further spread to everywhere in the light emitting layer 230. In detail, material of the current spreading layer 270 may be transparent and conductive, such as indium tin oxide (ITO) or indium zinc oxide (IZO), but the invention is not limited hereto.

It should be noted that although the second electrodes 260 of the aforementioned light emitting diode 200 and the light emitting diode 400 are disposed above the first surface 212 of the substrate 210, but the invention is not limited thereto. The following embodiments will describe another disposition of the second electrode of the light emitting diode of the invention.

Figure 5:
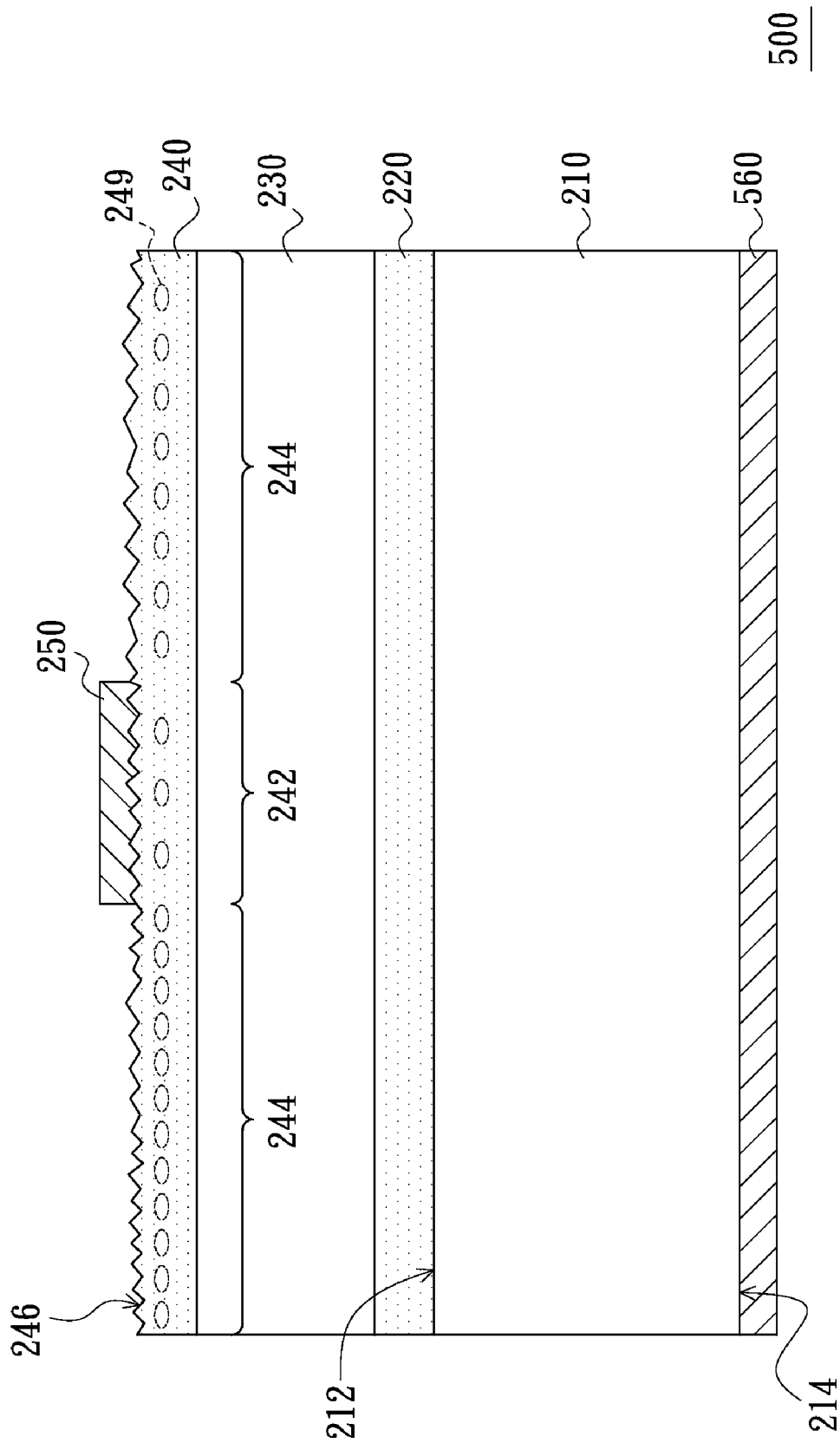
FIG. 5 is a schematic cross-sectional view of a light emitting diode in accordance with another embodiment of the present invention.

FIG. 5 is a schematic cross-sectional view of a light emitting diode in accordance with another embodiment of the present invention. Referring to FIG. 5, the light emitting diode 500 includes a substrate 210, a first-type semiconductor layer 220, a light emitting layer 230, a second-type semiconductor layer 240, a first electrode 250 and a second electrode 560. The substrate 210 has a first surface 212 and a second surface 214 opposite to each other. The first-type semiconductor layer 220, the light emitting layer 230, the second-type semiconductor layer 240 and the first electrode 560 are sequentially disposed on the first surface 212 of the substrate 210. The second electrode 560 is disposed at the second surface 214 of the substrate 210. The materials and structures of the devices of this embodiment having the same indices with the devices of the aforementioned embodiments are similar or the same therewith, it is not be reiterated herein.

Figure 6:
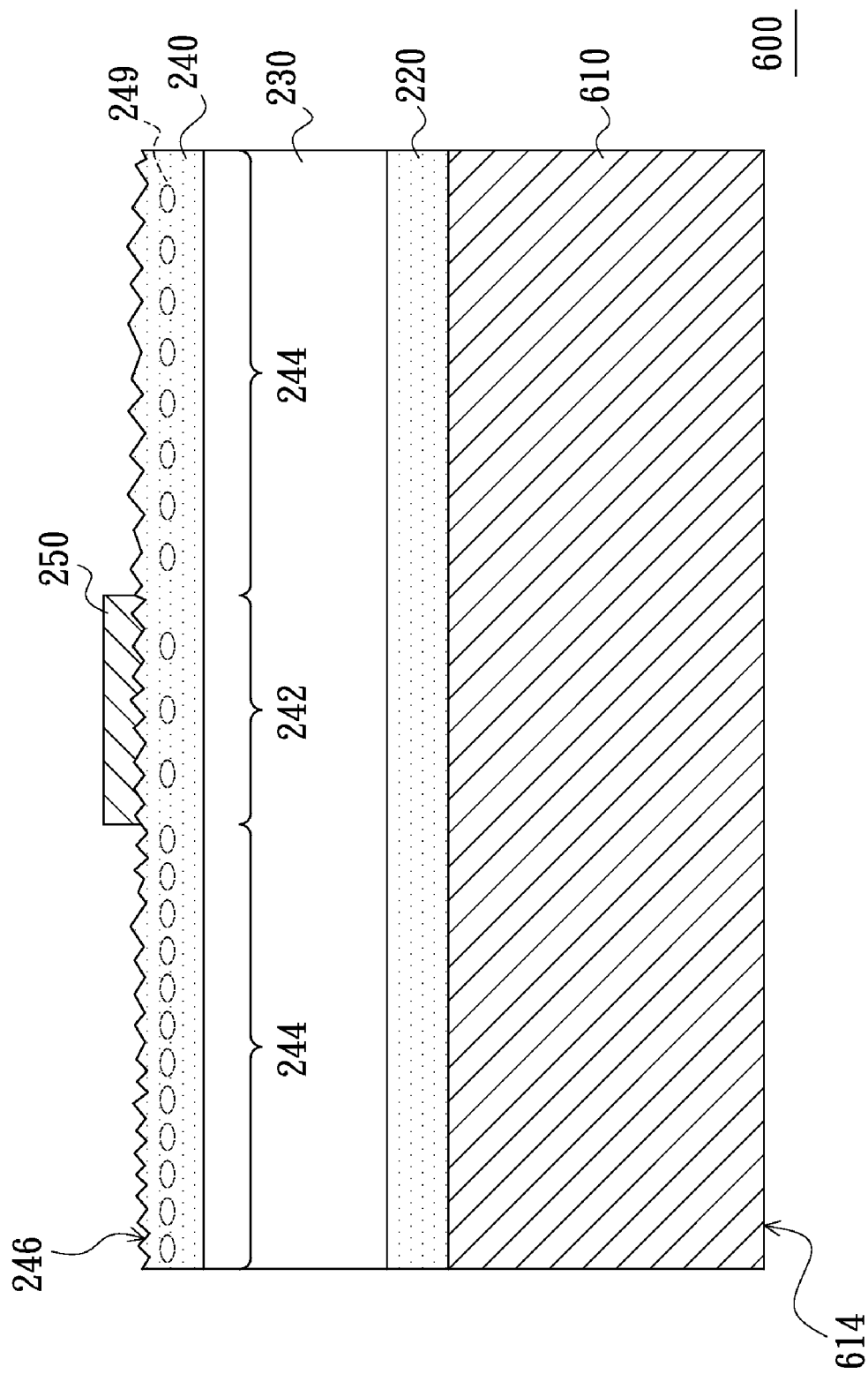
FIG. 6 is a schematic cross-sectional view of a light emitting diode in accordance with another embodiment of the present invention.

Besides, referring to FIG. 6, the substrate 610 of the light emitting diode 600 may be composed of conductive material. Thus, it is not necessary to dispose any electrode at the second surface 614 of the substrate 610.

For making the people skilled in the arts to understand the present invention, the following embodiments will describe fabricating methods of light emitting diode of the present invention cooperated with FIGS.

Figure 7A:
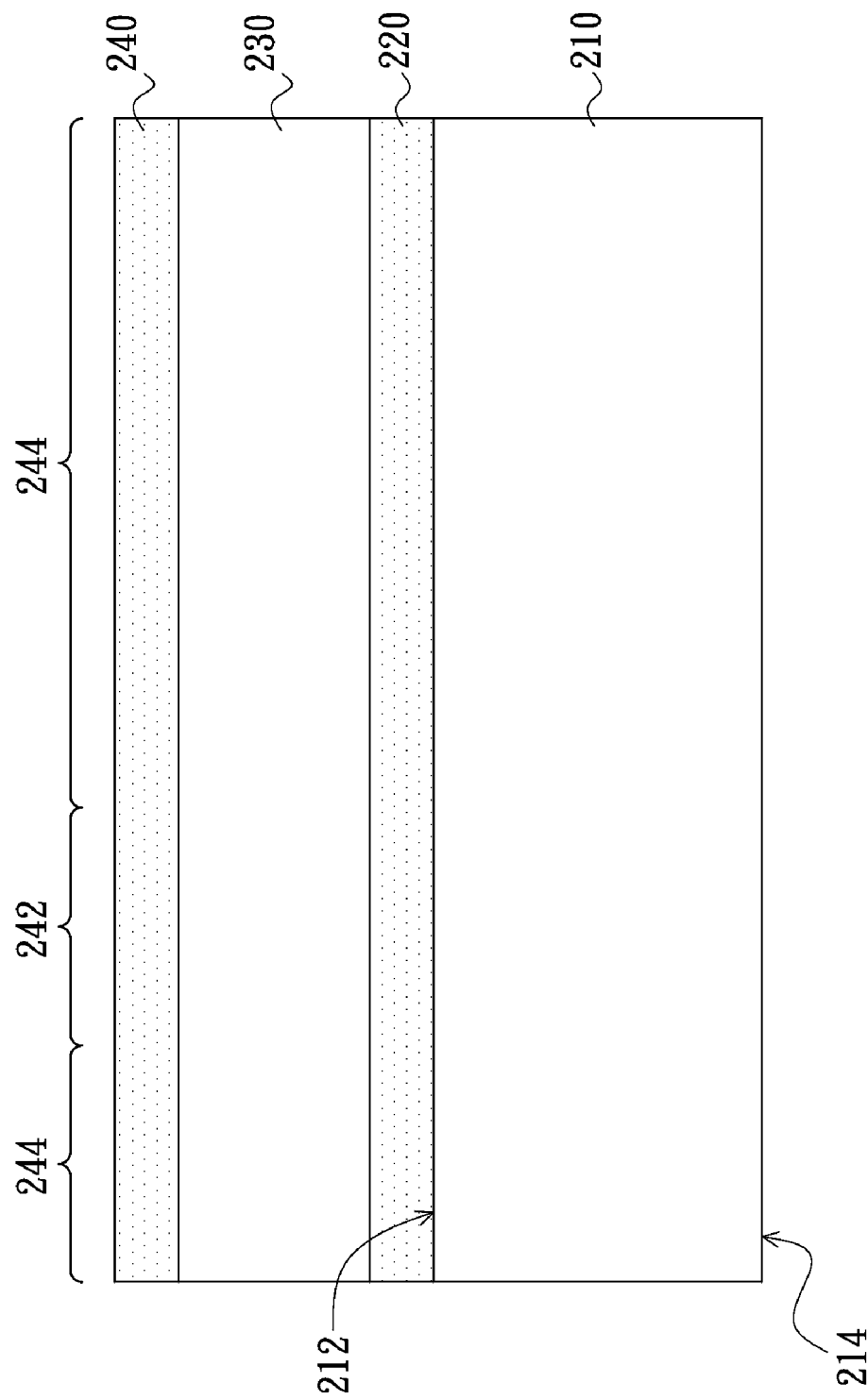
FIG. 7A through FIG. 7C are schematic cross-sectional views illustrating parts of fabricating process steps of a light emitting diode in accordance with an embodiment of the present invention.
Figure 7B:
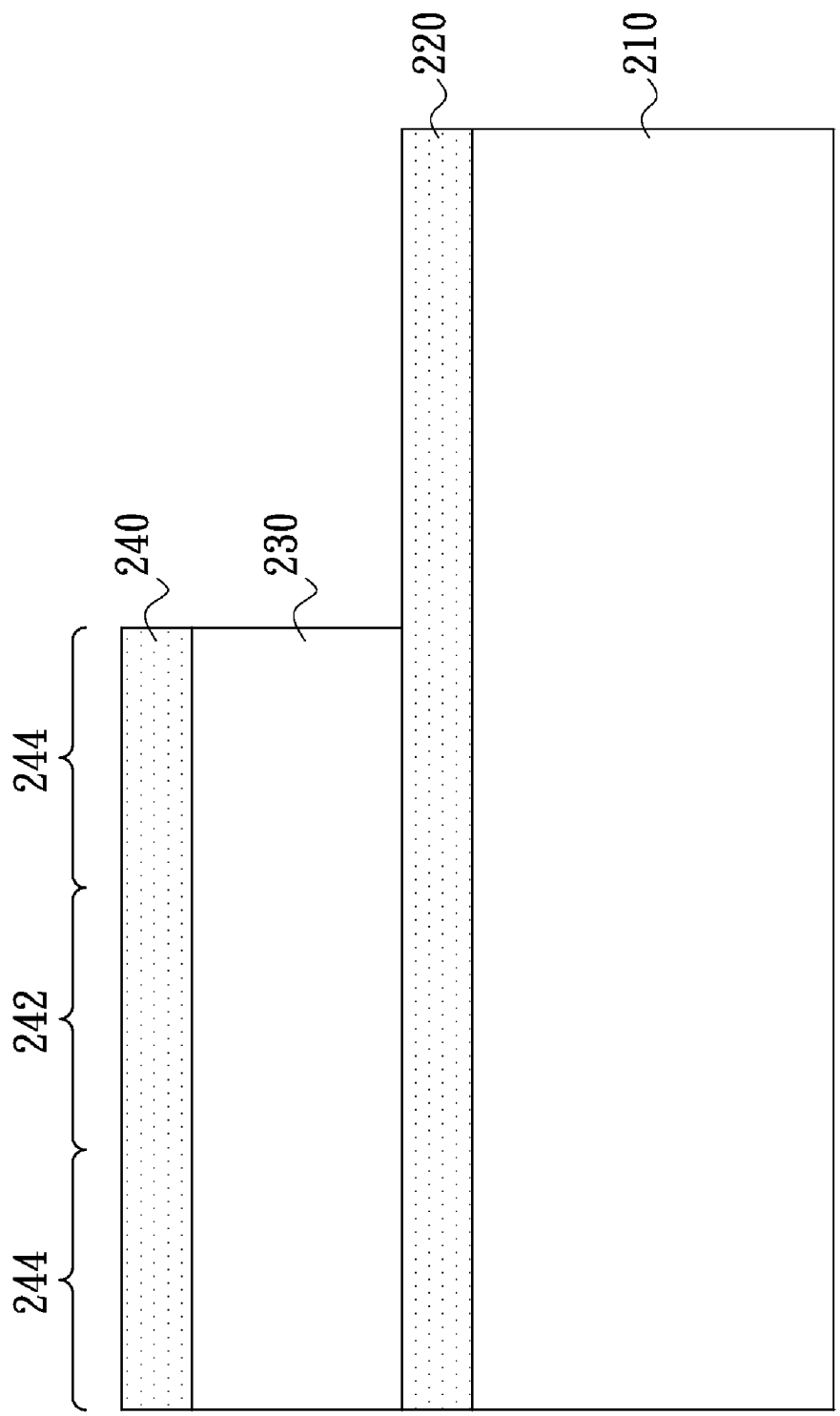
Figure 7C:
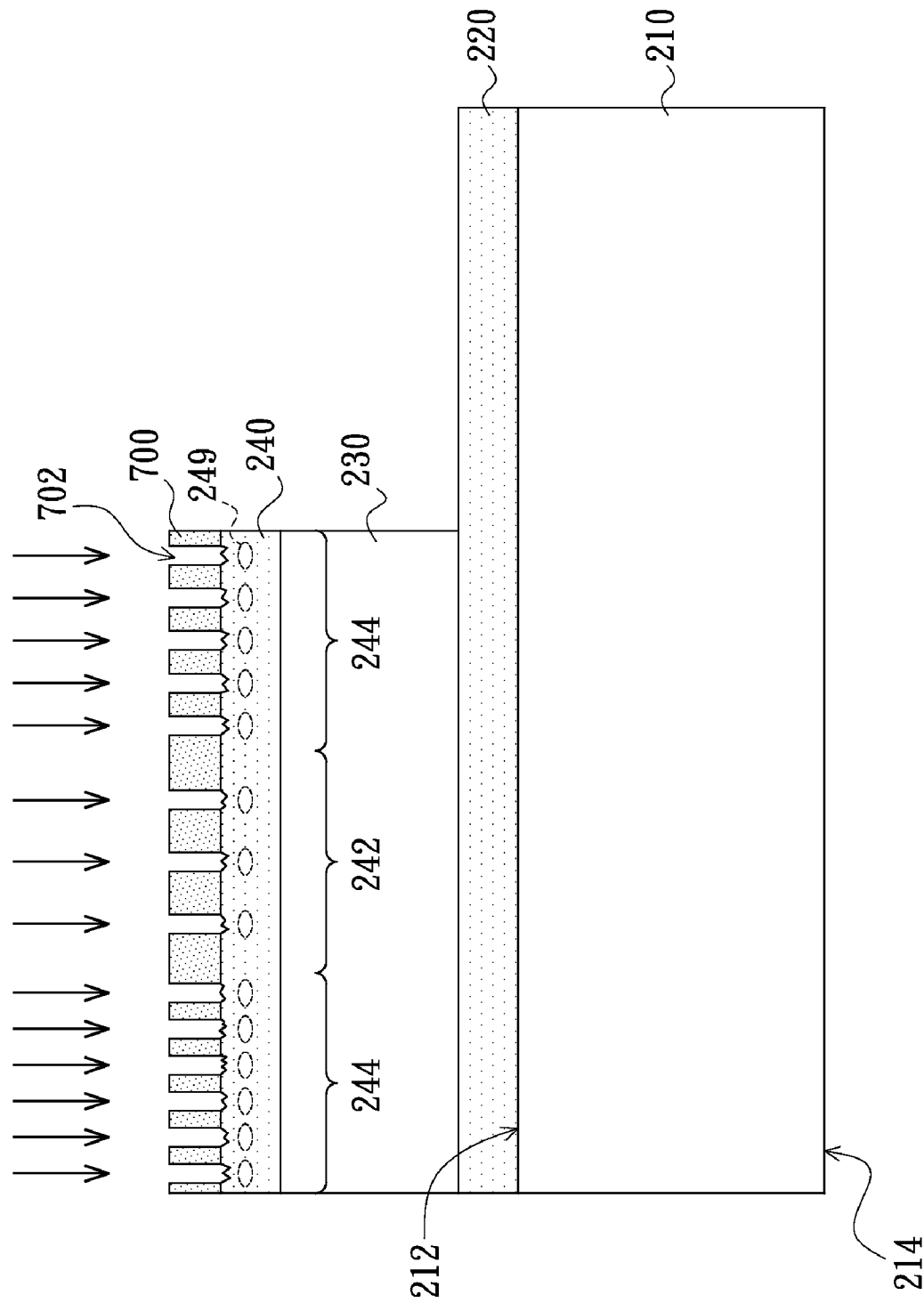
Figure 8:
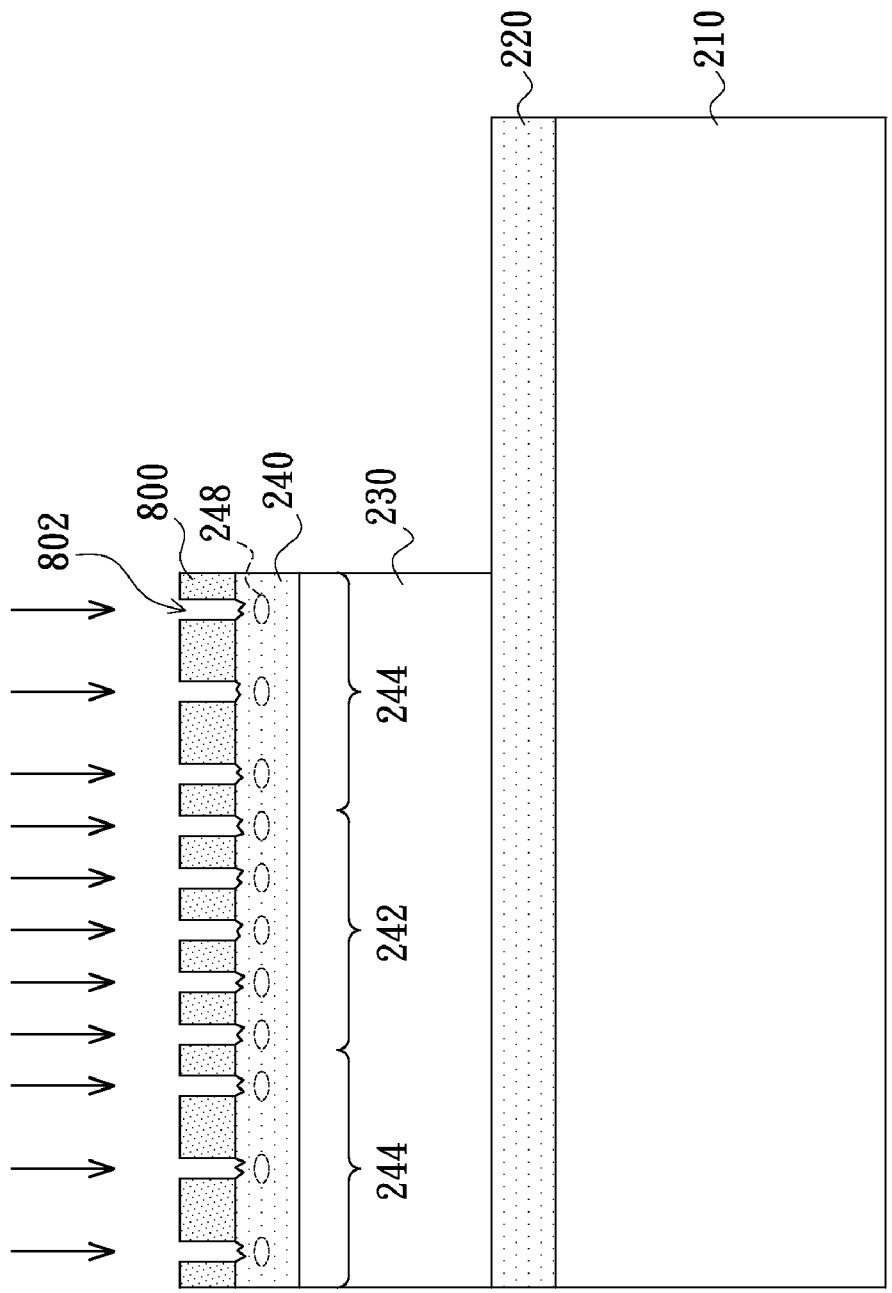
FIG. 8 is schematic cross-sectional views illustrating a part of fabricating process steps of a light emitting diode in accordance with an embodiment of the present invention.

FIG. 7A through FIG. 7C are schematic cross-sectional views illustrating parts of fabricating process steps of a light emitting diode in accordance with an embodiment of the present invention. Referring to FIG. 7A, a first-type semiconductor layer 220, a light emitting layer 230 and a second-type semiconductor layer 240 are sequentially formed on a first surface 212 of the substrate 210. Moreover, the second-type semiconductor layer 240 has a first region 242 and a second region 244.

In this embodiment, the first-type semiconductor layer 220, the light emitting layer 230 and the second-type semiconductor layer 240 are, for example, composed of III-V group compound semiconductor materials as described in aforementioned.

Referring to 7B, after forming the second-type semiconductor layer 240, portion of the stacked structure composed of the light emitting layer 230 and the second-type semiconductor layer is removed for exposing a part of the first-type semiconductor layer 220. Since the exposed portion of the first-type semiconductor layer 220 is provided for disposing the second electrode 260 (as illustrated in FIG. 2) formed in subsequent steps, the people skilled in the art may decide to whether or not to perform this removal step according to the predetermined position of the second electrode formed in subsequent steps. For the light emitting diode 500 illustrated in FIG. 5, the predetermined position of the second electrode 560 is at the second surface 214 of the substrate 210, so it is not necessary to pattern the second-type semiconductor layer 240 and the light emitting layer 230 during the fabricating process of the light emitting diode 500. Likewise, since the substrate 610 of the light emitting diode 600 as illustrated in FIG. 6 is conductive, and therefore the second electrode is not necessary. Thus, the second-type semiconductor layer 240 and the light emitting layer 230 need not be pattered during the fabricating process of the light emitting diode 600.

Referring to 7C, the second-type semiconductor layer 240 is doped with dopants by performing an ion implantation process. In detail, the first region 242 and the second region 244 are respectively doped with dopants with different densities, thus the first resistance of the first region 242 is larger than the second resistance of the second region 244.

In particular, the second-type semiconductor layer 240 is doped with the second-type dopants 249 which are the same types therewith, such as arsenic or phosphorous, by way of ion implantation. Moreover, the distribution density of the second-type dopants 249 doping in the first region 242 is smaller than that in the second region 244. In detail, the distribution density of the second-type dopants 249 doping in the first region 242 and the second region 244 may be determined according to the patterns of the photo mask layer used in ion implantation process, as illustrated in FIG. 7C. In this embodiment, the photo mask layer 700 used in ion implantation process has a plurality of openings 702 and the distribution density of the openings 702 corresponding to the first region 242 is smaller than the distribution density of the openings 702 corresponding to the second region 244.

In another embodiment of the invention, the second-type semiconductor layer 240 is doped with first-type dopants 248 which are different type therefrom, such as gallium or indium, by way of ion implantation. Moreover, the distribution density of the first-type dopant 248 doped in the first region 242 is larger than that in the second region 244. Herein, the distribution density of the openings 802 of the photo mask layer 800 corresponding to the first region 242 is larger than the distribution density of the openings 802 corresponding to the second region 244.

As aforementioned, in other embodiments, the second-type semiconductor layer 240 may be doped with non-polar dopants by performing the ion implantation process for making the first resistance of the first region 242 being larger than the second resistance of the second region 244 by way of changing lattice structure of the second-type semiconductor layer 240. Furthermore, the inner resistance of the second-type semiconductor layer 240 also may be determined according to the implant angle or energy of the dopants, thus the first resistance of the first region 242 is larger than the second resistance of the second region 244.

Particularly, the elements with heavy atomic weight are selected as the dopants during the ion implantation process of this embodiment, thus the surface of the second-type semiconductor layer 240 is roughened to form a rough surface 246 by using the energy of ion collision. Accordingly, the probability of total reflection of the light emitted from the light emitting layer 230 at the rough surface 246 may be decreased.

It should be noted that although the ion implantation process is performed after removing the portion of the light emitting layer 230 and the second-type semiconductor layer 240 in this embodiment, but the invention is not limited thereto. It should be known by the people skilled in the art that in the fabricating process of the light emitting diode of the invention, the ion implantation process may be performed before removing the portion of the light emitting layer 230 and the second-type semiconductor layer 240 to expose the part of the first-type semiconductor layer 220.

Referring to FIG. 2 again, a second electrode 260 is formed on the part of the first-type semiconductor layer 220 exposed by the light emitting layer 230 and a first electrode 250 is formed above the first region 242 of the second-type semiconductor layer 240. Thus far, the light emitting diode 200 is substantially fabricated.

Additionally, in another embodiment of the invention, a current spreading layer 270 is formed on the second-type semiconductor layer 240 before forming the first electrode 250 and then the first electrode 250 is formed on the current spreading layer 270, as illustrated in FIG. 4. The materials and the functions of the current spreading layer 270 are described in aforementioned embodiments.

In summary, since the second-type semiconductor layer of the light emitting diode of the invention has various resistances wherein the first region corresponding to the first electrode has larger resistance than the second region, the carriers provided from the second-type semiconductor layer inject into the light emitting layer from the second region and then combine with the carriers provided from the first-type semiconductor layer for generating light. That is, the effective light emitting area of the light emitting layer of the light emitting diode of the invention is not only exactly under the second electrode. Thus, the light may be emitted from the portion of the light emitting layer exposed by the second electrode so that the light emitting intensity of the light emitting diode may be improved.

Furthermore, since the second-type semiconductor layer of the invention is doped with dopants by performing ion implantation process to make the resistance of the first region located exactly under the first electrode be larger than the second region, the surface of the second-type semiconductor layer subjected to the ion collision may be roughened to form a rough surface. Therefore, the probability of total reflection of the light emitted from the light emitting layer at the rough surface may be decreased and the light emitting efficiency of the light emitting diode may be increased.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A light emitting diode, comprising:
   a substrate having a first surface and a second surface opposite to each other;
   a first-type semiconductor layer disposed at the first surface of the substrate;
   a light emitting layer disposed on the first-type semiconductor layer;
   a second-type semiconductor layer having a first region and a second region disposed on the light emitting layer, wherein the first region has a first resistance and the second region has a second resistance, the first resistance is larger than the second resistance, a joint surface of the first region and the second region is substantially perpendicular to an upper surface of the light emitting layer, and the first region and the second region are doped with the same dopant with different distribution densities in the first region compared to that in the second region; and a first electrode disposed above the first region of the second-type semiconductor layer.

2. The light emitting diode as claimed in claim 1, wherein the dopant is of a first-type and the first region has larger distribution density than that of the second region.

3. The light emitting diode as claimed in claim 1, wherein the dopant is of a second type and the first region has smaller distribution density than that of the second region.

4. The light emitting diode as claimed in claim 1, wherein the substrate is conductive.

5. The light emitting diode as claimed in claim 1, further comprising a second electrode disposed at the second surface of the substrate.

6. The light emitting diode as claimed in claim 1, further comprising a second electrode, and a part of the first-type semiconductor layer is covered by the light emitting layer, the second electrode is disposed on another part of the first-type semiconductor layer exposed by the light emitting layer.

7. The light emitting diode as claimed in claim 1, wherein the second-type semiconductor layer has a rough surface and the first electrode is disposed above the rough surface.

8. The light emitting diode as claimed in claim 1, further comprising a current spreading layer disposed on the second-type semiconductor layer, and the first electrode is disposed on the current spreading layer.

9. The light emitting diode as claimed in claim 8, wherein materials of the current spreading layer comprise transparent conductive materials.

10. The light emitting diode as claimed in claim 1, wherein materials of the first-type semiconductor layer, the light emitting layer and the second-type semiconductor layer comprise III-V group compound semiconductor materials.

11. The light emitting diode as claimed in claim 1, wherein the first electrode is in contact with the first region.

12. The light emitting diode as claimed in claim 1, wherein the second regions is in contact with the light emitting layer.

13. A light emitting diode, comprising:
 a substrate having a first surface and a second surface opposite to each other;
 a first-type semiconductor layer disposed at the first surface of the substrate;
 a light emitting layer disposed on the first-type semiconductor layer;
 a second-type semiconductor layer having a first region and a second region disposed on the light emitting layer, wherein the first region has a first resistance and the second region has a second resistance, the first resistance is larger than the second resistance; and
 a first electrode disposed above the first region of the second-type semiconductor layer, wherein the first region and the second region are connected in parallel between the light emitting layer and the first electrode, and the first region and the second region are doped with the same dopant with different distribution densities in the first region compared to that in the second region.

\* \* \* \* \*